US007476452B2

(12) United States Patent
Dobbs et al.

(10) Patent No.: US 7,476,452 B2
(45) Date of Patent: *Jan. 13, 2009

(54) ELECTROLUMINESCENT IRIDIUM COMPOUNDS WITH FLUORINATED PHENYLPYRIDINE LIGANDS, AND DEVICES MADE WITH SUCH COMPOUNDS

(75) Inventors: Kerwin D. Dobbs, Wilmington, DE (US); Norman Herron, Newark, DE (US); Viacheslav A. Petrov, Hockessin, DE (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 295 days.

This patent is subject to a terminal disclaimer.

(21) Appl. No.: 10/774,286

(22) Filed: Feb. 6, 2004

(65) Prior Publication Data

US 2005/0037233 A1    Feb. 17, 2005
US 2007/0292713 A9    Dec. 20, 2007

Related U.S. Application Data

(63) Continuation-in-part of application No. 10/768,298, filed on Jan. 30, 2004, now abandoned, and a continuation-in-part of application No. 10/366,295, filed on Feb. 13, 2003, now abandoned, which is a continuation of application No. 09/879,014, filed on Jun. 21, 2001, now abandoned.

(60) Provisional application No. 60/224,273, filed on Aug. 10, 2000, provisional application No. 60/215,362, filed on Jun. 30, 2000.

(51) Int. Cl.
   *H01L 51/54*    (2006.01)
   *C09K 11/06*    (2006.01)
   *C07D 213/02*   (2006.01)

(52) U.S. Cl. .......................... 428/690; 428/917; 546/4; 546/304; 546/312; 313/504; 257/40; 257/E51.044

(58) Field of Classification Search ........................ 546/4
   See application file for complete search history.

(56) References Cited

U.S. PATENT DOCUMENTS

| 5,552,678 | A  | 9/1996  | Tang et al. |
| 6,303,238 | B1 | 10/2001 | Thompson et al. |
| 6,670,645 | B2 | 12/2003 | Grushin et al. |
| 6,916,554 | B2 * | 7/2005 | Ma et al. ................. 428/690 |
| 6,919,139 | B2 * | 7/2005 | Grushin et al. ............ 428/690 |
| 6,953,628 | B2 * | 10/2005 | Kamatani et al. .......... 428/690 |
| 7,011,897 | B2 * | 3/2006 | Thompson et al. ......... 428/690 |
| 2001/0019782 | A1 | 9/2001 | Igarashi et al. |
| 2001/0053462 | A1 | 12/2001 | Mishima |
| 2002/0134984 | A1 * | 9/2002 | Igarashi ................. 257/79 |
| 2002/0182441 | A1 | 12/2002 | Lamansky et al. |
| 2003/0124381 | A1 | 7/2003 | Thompson et al. |
| 2003/0197183 | A1 | 10/2003 | Grushin et al. |
| 2004/0197602 | A1 | 10/2004 | Dobbs et al. |
| 2005/0037233 | A1 | 2/2005 | Dobbs et al. |
| 2005/0048312 | A1 * | 3/2005 | Herron et al. ............. 428/690 |

FOREIGN PATENT DOCUMENTS

| EP | 1 175 128 A2 | 1/2002 |
| EP | 1 191 614 A2 | 3/2002 |
| WO | WO 96/03410 A1 | 2/1996 |
| WO | WO 00/57676 A1 | 9/2000 |
| WO | WO 00/70655 A2 | 11/2000 |
| WO | WO 01/41512 A1 | 6/2001 |
| WO | WO 02/02714 A2 | 1/2002 |
| WO | WO 02/15645 A1 | 2/2002 |
| WO | WO 02/44189 A1 | 6/2002 |
| WO | WO 03/040257 A | 5/2003 |
| WO | WO 03/063555 A | 7/2003 |
| WO | WO 03/069961 A1 | 8/2003 |
| WO | WO 03/084972 A1 | 10/2003 |

OTHER PUBLICATIONS

Djurovich, Peter I. et al., Ir(III) Cyclometalated Complexes As Efficient Phosphorescent Emitters in Polymer Blend and Organic LEDs, Polymer Preprints, 2000, 770-771, 41(1).

Chatani, Naoto et al., Ru3(CO)12-Catalyzed Reaction of Pyridylbenzenes with Carbon Monoxide and Olefins. Carbonylation at a C-H Bond in the Benzene Ring, J. Org. Chem., 1997, 2604-2610, 62, American Chemical Society.

Gosmini, Corinne et al., Electrosynthesis of functionalized 2-arylpyridines from functionalized aryl and pyridine halides catalyzed by nickel bromide 2,2'-bipyridine complex, Tetrahedron Letters, 2000, 5039-5042, 41, Elsevier Science Ltd.

Cacchi, Sandro et al., The Palladium-Catalyzed Transfer Hydrogenation/Heterocyclization of B-(2-Aminophenyl-a,B-ynones. An Approach to 2-Aryl- and 2-Vinylquinolines, Synlett, 1999, 401-404, No. 4, Thieme Stuttgart, New York.

Baldo, M. A. et al., Very high-efficiency green organic light-emitting devices based on electrophosphorescence, Applied Physics Letters, Jul. 5, 1999, 4-6, 75(1) American Institue of Physics.

Baldo, M. A. et al., High-efficiency fluorescent organic light-emitting devices using a phosphorescent sensitizer, Nature, Feb. 17, 2000, 750-753, 403, Macmillan Magazines Ltd.

(Continued)

Primary Examiner—Marie R. Yamnitzky
(74) Attorney, Agent, or Firm—John H. Lamming

(57) ABSTRACT

The present invention is generally directed to electroluminescent Ir(III) compounds, the substituted 2-phenylpyridines that are used to make the Ir(III) compounds, and devices that are made with the Ir(III) compounds.

2 Claims, 1 Drawing Sheet

OTHER PUBLICATIONS

Wang, Yue et al., (Hydroxyphenyl)pyridine derivative, its metal complexes and application as electroluminescence material, Chemical Abstracts Service, Mar. 1, 2000, Database No. 133:315395.

Dedeian K. et al., A New Synthetic Route to the Preparation of a Series of Strong Photoreducing Agents: fac Tris-Ortho-Metalated Complexes of Iridium(III) with Substituted 2-Phenylpyridines, Inorg. Chem., 1991, 1685-1687, 30(8), American Chemical Society.

Lamansky, Sergey et al., Highly Phosphorescent Bis-Cyclometalated Iridium Complexes: Synthesis, Photophysical Characterization, and Use in Organic Light Emitting Devices, J. Am. Chem. Soc., 2001, 4304-4312, 123, American Chemical Society.

Lamansky, Sergey et al., Synthesis and Characterization of Phosphorescent Cyclometalated Iridium Complexes, Inorg. Chem., 2001, 1704-1711, 40, American Chemical Society.

Lamansky Sergey et al., Molecularly doped polymer light emitting diodes utilizing phosphorescent Pt(II) and Ir (III) dopants, Organic Electronics, 2001, 53-62, 2, Elsevier Science B.V.

Notification of Transmittal of the International Search Report Dated Oct. 13, 2005, International Appln. No. PCT/US2005/003338, International Filing Date: Jan. 28, 2005, 8 Pages.

Written Opinion of the International Searching Authority Dated Oct. 13, 2005, International Appln. No. PCT/US2005/003338, International Filing Date: Jan. 28, 2005, 10 Pages.

* cited by examiner

ELECTROLUMINESCENT IRIDIUM COMPOUNDS WITH FLUORINATED PHENYLPYRIDINE LIGANDS, AND DEVICES MADE WITH SUCH COMPOUNDS

CROSS REFERENCE TO RELATED APPLICATIONS

"This application is a Continuation-in-Part of U.S. Ser. No. 10/768,298, filed Jan. 30, 2004, now abandoned, and a Continuation-in-Part of U.S. Ser. No. 10/366,295, filed Feb. 13, 2003, which is a Continuation of U.S. Ser. No. 09/879,014, filed Jun. 12, 2001, now abandoned, and which claims priority from U.S. Provisional Application No. 60/224,273, filed Aug. 10, 2000, and U.S. Provisional Application No. 60/215,362, filed Jun. 30, 2000."

BACKGROUND OF THE INVENTION

1. Field of the Invention

This invention relates to electroluminescent complexes of iridium(III) with fluorinated phenylpyridines. It also relates to electronic devices in which the active layer includes an electroluminescent Ir(III) complex.

2. Description of the Related Art

Organic electronic devices that emit light, such as light-emitting diodes that make up displays, are present in many different kinds of electronic equipment. In all such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, Friend et al., U.S. Pat. No. 5,247,190, Heeger et al., U.S. Pat. No. 5,408,109, and Nakano et al., Published European Patent Application 443 861. Complexes of 8-hydroxyquinolate with trivalent metal ions, particularly aluminum, have been extensively used as electroluminescent components, as has been disclosed in, for example, Tang et al., U.S. Pat. No. 5,552,678.

Burrows and Thompson have reported that fac-tris(2-phenylpyridine) iridium can be used as the active component in organic light-emitting devices. (*Appl. Phys. Lett.* 1999, 75, 4.) The performance is maximized when the iridium compound is present in a host conductive material. Thompson has further reported devices in which the active layer is poly(N-vinyl carbazole) doped with fac-tris[2-(4',5'-difluorophenyl)pyridine-$C'^2$,N]iridium(III). (Polymer Preprints 2000, 41(1), 770.) Electroluminescent iridium complexes having fluorinated phenylpyridine, phenylpyrimidine, or phenylquinoline ligands have been disclosed in published application WO 02/02714.

However, there is a continuing need for electroluminescent compounds.

SUMMARY OF THE INVENTION

The present invention is directed to an iridium compound (generally referred as "Ir(III) compounds") having Formula I:

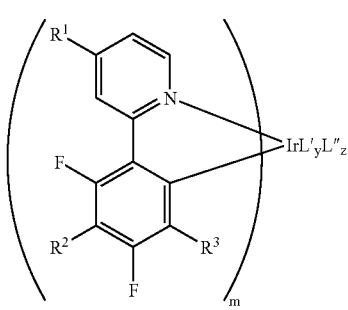

wherein:
$R^1$=H, $R^4$, $OR^4$, $N(R^4)_2$
$R^2$=H, $C_nF_{2n+1}$, $C_nF_{2n+1}SO_2$, $COOR^4$, CN
$R^3$=H, $C_nF_{2n+1}$, $C_nF_{2n+1}SO_2$, $COOR^4$, CN
$R^4$ is the same or different at each occurrence and is H, alkyl, aryl, or adjacent $R^4$ groups can join together to form a 5- or 6-membered ring,
L'=a bidentate ligand and is not a phenylpyridine, phenylpyrimidine, or phenylquinoline;
L"=a monodentate ligand, and is not a phenylpyridine, and phenylpyrimidine, or phenylquinoline;
m=1, 2 or 3,
n is an integer from 1 through 20,
y=0, 1 or 2, and
z=0 or an integer from 1 through 4,
with the proviso that the compound is charge neutral and the iridium is hexacoordinate.

In another embodiment, the present invention is directed to substituted 2-phenylpyridine precursor compounds from which the above Ir(III) compounds are made. The precursor compounds have a Formula II below:

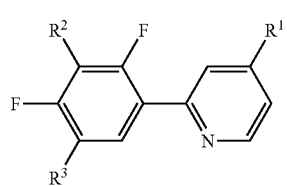

where $R^1$, $R^2$, and $R^3$ are as defined in Formula I above.

It is understood that there is free rotation about the phenylpyridine bond. However, for the discussion herein, the compounds will be described in terms of one orientation.

In another embodiment, the present invention is directed to an organic electronic device having at least one layer comprising the above Ir(III) compound, or combinations of the above Ir(III) compounds.

DETAILED DESCRIPTION OF THE PREFERRED EMBODIMENTS

Figure 1:
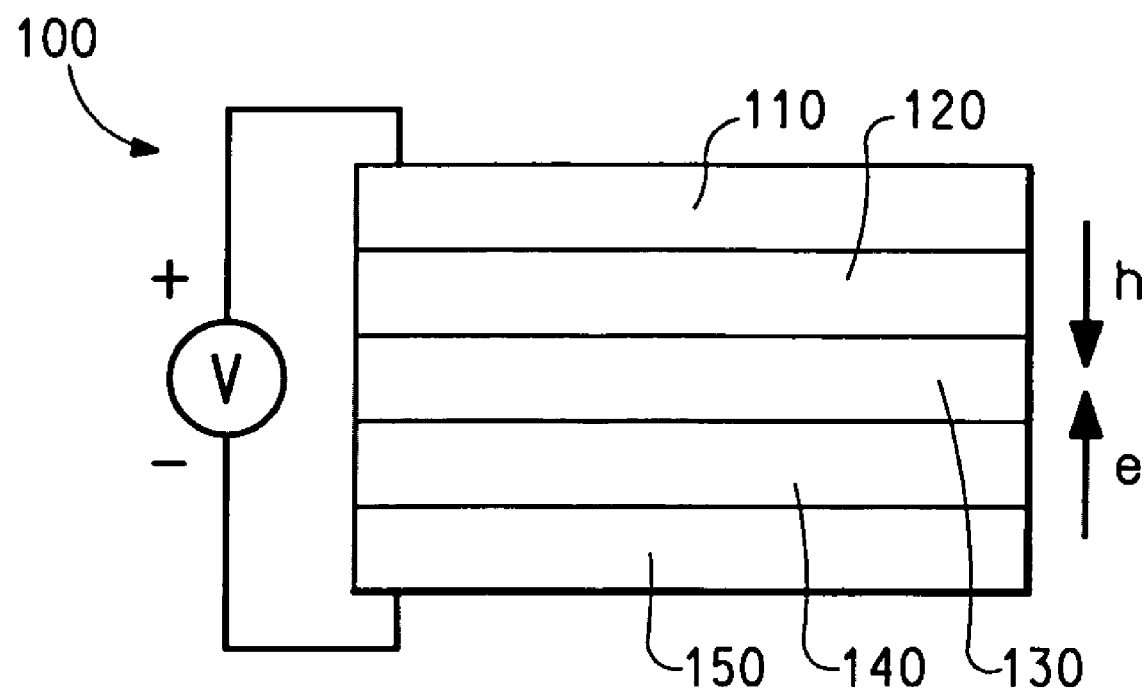
FIG. 1 is a schematic diagram of one illustrative example of a light-emitting device (LED).

The complexes of the invention have Formula I described above.

In one embodiment of Formula I, $R^2$ and $R^3$ are independently selected from H, $CF_3$, $C_2F_5$, n-$C_3F_7$, i-$C_3F_7$, $C_4F_9$, $CF_3SO_2$, COOR' and CN.

In one embodiment of Formula I, L' ligand is a monoanionic bidentate ligand. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

The β-enolate ligands generally have the Formula III

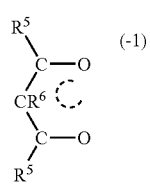

(III)

where $R^5$ is the same or different at each occurrence. The $R^5$ groups can be hydrogen, halogen, substituted or unsubstituted alkyl, aryl, alkylaryl or heterocyclic groups. Adjacent $R^5$ and $R^6$ groups can be joined to form five- and six-membered rings, which can be substituted. In one embodiment, $R^5$ groups are selected from $C_n(H+F)_{2n+1}$, —$C_6H_5$, c-$C_4H_3S$, and c-$C_4H_3O$, where n is an integer from 1 through 20. The $R^6$ group can be H, substituted or unsubstituted, alkyl, aryl, alkylaryl, heterocyclic groups or fluorine.

Examples of suitable β-enolate ligands include the compounds listed below. The abbreviation for the β-enolate form is given below in brackets.

2,4-pentanedionate [acac]
1,3-diphenyl-1,3-propanedionate [DI]
2,2,6,6-tetramethyl-3,5-heptanedionate [TMH]
4,4,4-trifluoro-1-(2-thienyl)-1,3-butanedionate [TTFA]
7,7-dimethyl-1,1,1,2,2,3,3-heptafluoro-4,6-octanedionate [FOD]
1,1,1,3,5,5,5-heptafluoro-2,4-pentanedionate [F7acac]
1,1,1,5,5,5-hexaflouro-2,4-pentanedionate [F6acac]
1-phenyl-3-methyl-4-1-butyryl-pyrazolinonate [FMBP]

The β-dicarbonyl parent compounds, are generally available commercially. The parent compound 1,1,1,3,5,5,5-heptafluoro-2,4pentanedione, $CF_3C(O)CFHC(O)CF_3$, can be prepared using a two-step synthesis, based on the reaction of perfluoropentene-2 with ammonia, followed by a hydrolysis step according to the procedure published in *Izv. AN USSR. Ser. Khim.* 1980, 2827 This compound should be stored and reacted under anhydrous conditions as it is susceptible to hydrolysis.

The hydroxyquinolinate ligands can be substituted with groups such as alkyl or alkoxy groups which may be partially or fully fluorinated. Examples of suitable hydroxyquinolinate ligands include (with abbreviation provided in brackets):

8-hydroxyquinolinate [8hq]
2-methyl-8-hydroxyquinolinate [Me-8hq]
10-hydroxybenzoquinolinate [10-hbq]

The parent hydroxyquinoline compounds are generally available commercially.

Phosphino alkoxide ligands generally have Formula IV:

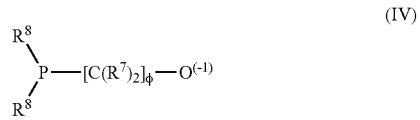

(IV)

where
$R^7$ can be the same or different at each occurrence and is selected from H and $C_n(H+F)_{2n+1}$,
$R^8$ can be the same or different at each occurrence and is selected from $C_n(H+F)_{2n+1}$ and $C_6(H+F)_5$, or $C_6H_{5-b}(R^9)_b$,
$R^9$=$CF_3$, $C_2F_5$, n-$C_3F_7$, i-$C_3F_7$, $C_4F_9$, $CF_3SO_2$, and
φ is 2 or 3;
b is 0-5; and
n is 1-20.

Examples of suitable phosphino alkoxide ligands include (with abbreviation provided in brackets):

3-(diphenylphosphino)-1-oxypropane [dppO]
1,1-bis(trifluoromethyl)-2-(diphenylphosphino)-ethoxide [tfmdpeO]

Some of the parent phosphino alkanol compounds are available commercially, or can be prepared using known procedures, such as, for example, the procedure reported for tfmdpeO in *Inorg. Chem.* 1985, v.24, p.3680 or in *J. Fluorine Chem.* 2002, 117, 121

In one embodiment, L' is a ligand coordinated through a carbon atom which is part of an aromatic group. The ligand can have Formula V:

(V)

wherein Ar is an aryl or heteroaryl group, Y is a group having a heteroatom capable of coordinating to Ir, q is 0 or an integer from 1 through 20, p is an integer from 1 through 5, and further wherein one or more of the carbons in $(CH_2)_q$ can be replaced with a heteroatom and one or more of the hydrogens in $(CH_2)_q$ can be replaced with D or F.

In one embodiment, Y is selected from $N(R^{10})_2$, $OR^{10}$, $SR^{10}$, and $P(R^{11})_2$, wherein $R^{10}$ is the same or different at each occurrence and is H, $C_nH_{2n+1}$ or $C_n(H+F)_{2n+1}$ and $R^{11}$ is the same or different at each occurrence and is selected from H, $R^{10}$, Ar and substituted Ar.

In one embodiment, Ar is phenyl, q is 1, Y is $P(Ar)_2$, and p is 1 or 2.

Monodentate ligand L" can be anionic or nonionic. Anionic ligands include, but are not limited to, H— ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as L', such as β-enolates and phosphinoakoxides, can act as monodentate ligands. The monodentate ligand can also be a coordinating anion such as halide, nitrate, sulfate, hexahaloantimonate, and the like. These ligands are generally available commercially.

The monodentate L" ligand can be a non-ionic ligand, such as CO or a monodentate phosphine ligand. The phosphine ligands can have Formula VI $PAr_3$ (VI)

where Ar represents an aryl or heteroaryl group. The Ar group can be unsubstituted or substituted with alkyl, heteroalkyl, aryl, heteroaryl, halide, carboxyl, sulfoxyl, or amino groups. The phosphine ligands are generally available commercially.

In one embodiment of Formula I, the compound is tris-cyclometallated, with m=3 and y=z=0. The compound can be facial, meridional, or a combination of isomers.

In one embodiment of Formula I, m=2. In one embodiment, y=1 and z=0.

In one embodiment of Formula I, m=1. In one embodiment y=1 and z=2. In one embodiment at least one L" ligand is a hydride. In one embodiment L' is a ligand coordinated through a carbon atom which is part of an aromatic group.

In one embodiment, the complexes having Formula I exhibit blue luminescence. In one embodiment, the complexes have photoluminescent and/or electroluminescent spectra which have a maximum at 500 nm or Is less. In one embodiment, the maximum is less than 480 nm.

Examples of iridium complexes having Formula I are given in Table 1 below.

TABLE 1

| | Complexes of Formula I where z = 0 | | | | | |
|---|---|---|---|---|---|---|
| Complex | $R^1$ | $R^2$ | $R^3$ | m | L' | y |
| 1-a | H | H | H | 3 | — | 0 |
| 1-b | H | $CF_3$ | H | 3 | — | 0 |
| 1-c | H | COOMe | H | 3 | — | 0 |
| 1-d | H | CN | H | 3 | — | 0 |
| 1-e | $CH_3$ | H | H | 3 | — | 0 |
| 1-f | $CH_3$ | $CF_3$ | H | 3 | — | 0 |
| 1-g | $CH_3$ | COOMe | H | 3 | — | 0 |
| 1-h | $CH_3$ | CN | H | 3 | — | 0 |
| 1-i | $CH_3$ | H | H | 2 | PO | 1 |
| 1-j | t-butyl | H | H | 3 | — | 0 |
| 1-k | OMe | $CF_3$ | H | 3 | — | 0 |
| 1-l | OMe | COOMe | H | 3 | — | 0 |
| 1-m | OMe | CN | H | 3 | — | 0 |
| 1-n | OMe | $CF_3$ | $CF_3$ | 3 | — | 0 |
| 1-o | $NMe_2$ | H | H | 3 | — | 0 |
| 1-p | $NMe_2$ | $CF_3$ | H | 3 | — | 0 |
| 1-q | $NMe_2$ | COOMe | H | 3 | — | 0 |
| 1-r | $NMe_2$ | CN | H | 3 | — | 0 |
| 1-s | $NMe_2$ | $CF_3SO_2$ | H | 3 | — | 0 |
| 1-t | $NMe_2$ | $C_2F_5$ | H | 3 | — | 0 |
| 1-u | $NMe_2$ | $CF(CF_3)_2$ | H | 3 | — | 0 |
| 1-v | $NMe_2$ | H | H | 2 | PO | 1 |
| 1-w | $NPh_2$ | $CF_3$ | H | 3 | — | 0 |
| 1-x | $NPh_2$ | COOMe | H | 3 | — | 0 |
| 1-y | $NPh_2$ | CN | H | 3 | — | 0 | where "PO" represents the bidentate monoanionic ligand having Formula VII:

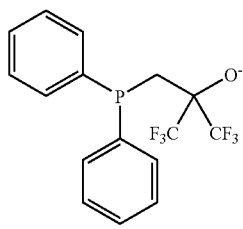

(VII)

In one embodiment of Formula I, the complex comprises a ligand derived from ligand precursors having Formula VIII, Formula IX, Formula X, Formula XI, and Formula XII below:

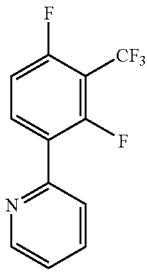

(VIII)

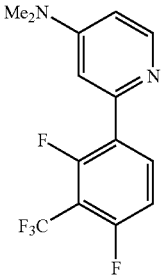

(IX)

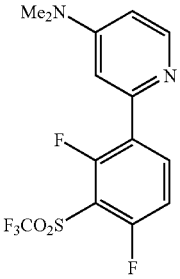

(X)

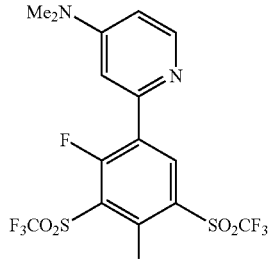

(XI)

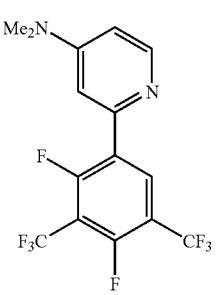

(XII)

The Ir(III) compounds are neutral and non-ionic, and can be sublimed intact. Thin films of these materials obtained via vacuum deposition exhibit good to excellent electroluminescent properties. Introduction of fluorine substituents into the ligands on the iridium atom increases both the stability and volatility of the complexes. As a result, vacuum deposition can be carried out at lower temperatures and decomposition of the complexes can be avoided. Introduction of fluorine substituents into the ligands can often reduce the non-radiative decay rate and the self-quenching phenomenon in the solid state. These reductions can lead to enhanced luminescence efficiency.

The iridium complexes of the invention are generally prepared from the appropriate substituted 2-phenylpyridine compound. The substituted 2-phenylpyridines, as shown in Formula II above, are prepared, in good to excellent yield, using the Suzuki coupling of the substituted 2-chloropyridine with arylboronic acid as described in O. Lohse, P. Thevenin, E. Waldvogel *Synlett,* 1999, 45-48. This reaction is illustrated in Equation (1) below:

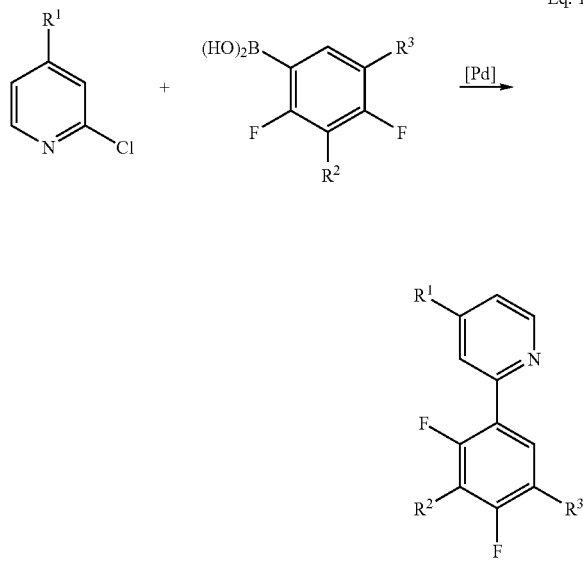

Eq. 1

Examples of 2-phenylpyridine compounds are Formulae VIII through XII, shown above.

The 2-phenylpyridines thus prepared are used for the synthesis of the cyclometalated iridium complexes. A convenient one-step method has been developed employing commercially available iridium trichloride hydrate and silver trifluoroacetate. The reactions are generally carried out with an excess of 2-phenylpyridine, pyrimidine, or quinoline, without a solvent, in the presence of 3 equivalents of $AgOCOCF_3$. This reaction is illustrated in Equation (2) below:

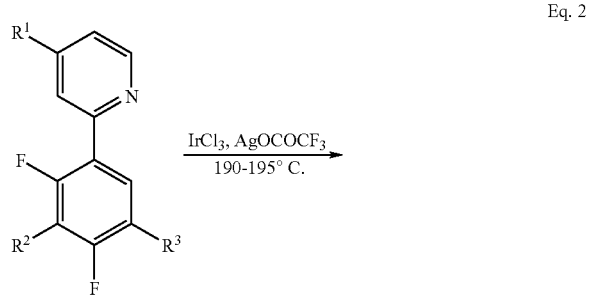

Eq. 2

-continued

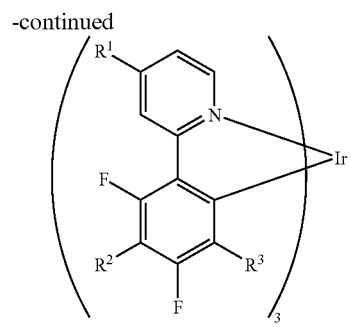

Tris-cyclometalated iridium complexes having Formula I where m=3, can be isolated, purified, and fully characterized by elemental analysis, $^1H$ and $^{19}F$ NMR spectral data, and, for compounds, single crystal X-ray diffraction. In some cases, mixtures of isomers are obtained. Often the mixture can be used without isolating the individual isomers.

Bis-cyclometalated iridium complexes having Formula I where m=2, may, in some cases, be isolated from the reaction mixture using the same synthetic procedures as preparing the tris-cyclometalated complexes above. The complexes can also be prepared by first preparing an intermediate iridium dimer

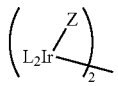

where L is the same or different and is a phenylpyridine ligand, and Z is Cl or $OR^{12}$, where $R^{12}$ is H, $CH_3$, or $C_2H_5$. The iridium dimers can generally be prepared by first reacting iridium trichloride hydrate with the 2-phenylpyridine and optionally adding $NaOR^{12}$.

Mono-cyclometalated iridium complexes of the invention can, in some cases, be isolated from reaction mixtures formed by the above-described processes. Such mono-cyclometallated species can be favored by use of phosphine containing ligands such as that shown in formula VII and by using a stoichiometric excess of such ligands (>2equivalents per Ir). These materials can be isolated from the reaction mixture by standard techniques, such as chromatography on silica with methylene chloride eluent.

Electronic Device

The present invention also relates to an electronic device comprising at least one layer positioned between two electrical contact layers, wherein the at least one layer of the device includes the iridium complex of the invention. Devices frequently have additional hole transport and electron transport layers. A typical structure is shown in FIG. 1. The device 100 has an anode layer 110 and a cathode layer 150. Adjacent to the anode is a layer 120 comprising hole transport material. Adjacent to the cathode is a layer 140 comprising an electron transport material. Between the hole transport layer and the electron transport layer is the photoactive layer 130.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are describe in Markus, John, *Electronics and Nucleonics Dictionary*, 470 and 476 (McGraw-Hill, Inc. 1966).

The iridium compounds of the invention are particularly useful as the photoactive material in layer 130, or as electron transport material in layer 140. Preferably the iridium complexes of the invention are used as the light-emitting material in diodes. It has been found that in these applications, the fluorinated compounds of the invention do not need to be in a solid matrix diluent in order to be effective. A layer that is greater than 20% by weight iridium compound, based on the total weight of the layer, up to 100% iridium compound, can be used as the emitting layer. This is in contrast to the non-fluorinated iridium compound, tris(2-phenylpyridine) iridium (III), which was found to achieve maximum efficiency when present in an amount of only 6-8% by weight in the emitting layer. This was necessary to reduce the self-quenching effect. Additional materials can be present in the emitting layer with the iridium compound. For example, a fluorescent dye may be present to alter the color of emission. A diluent may also be added and such diluent may be a charge transport material or an inert matrix. A diluent may comprise polymeric materials, small molecule or mixtures thereof. A diluent may act as a processing aid, may improve the physical or electrical properties of films containing the iridium compound, may decrease self-quenching in the iridium compounds described herein, and/or may decrease the aggregation of the iridium compounds described herein. Non-limiting examples of suitable polymeric materials include poly(N-vinyl carbazole), conjugated polymers, and polysilane. Non-limiting examples of suitable small molecules includes 4,4'-N,N'-dicarbazole biphenyl or tertiary aromatic amines. Examples of suitable conjugated polymers include polyarylenevinylenes, polyfluorenes, polyoxadiazoles, polyanilines, polythiophenes, polyphenylenes, copolymers thereof and combinations thereof. The conjugated polymer can be a copolymer having non-conjugated portions, for example, acrylic, methacrylic, or vinyl monomeric units. In one embodiment, the diluent comprises homopolymers and copolmers of fluorine and substituted fluorenes. When a diluent is used, the iridium compound is generally present in a small amount. In one embodiment, the iridium compound is less than 20% by weight, based on the total weight of the layer. In one embodiment, the iridium compound is less than 10% by weight, based on the total weight of the layer.

In some cases the iridium complexes may be present in more than one isomeric form, or mixtures of different complexes may be present. It will be understood that in the above discussion of OLEDs, the term "the iridium compound" is intended to encompass mixtures of compounds and/or isomers.

To achieve a high efficiency LED, the HOMO (highest occupied molecular orbital) of the hole transport material should align with the work function of the anode, the LUMO (lowest un-occupied molecular orbital) of the electron transport material should align with the work function of the cathode. Chemical compatibility and sublimation temp of the materials are also important considerations in selecting the electron and hole transport materials.

The other layers in the OLED can be made of any materials which are known to be useful in such layers. The anode 110, is an electrode that is particularly efficient for injecting positive charge carriers. It can be made of, for example materials containing a metal, mixed metal, alloy, metal oxide or mixed-metal oxide, or it can be a conducting polymer. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The IUPAC numbering system is used throughout, where the groups from the Periodic Table are numbered from left to right as 1-18 (CRC Handbook of Chemistry and Physics, 81$^{st}$ Edition, 2000). The anode 110 may also comprise an organic material such as polyaniline as described in "Flexible light-emitting diodes made from soluble conducting polymer," *Nature* vol. 357, pp 477-479 (11 Jun. 1992). At least one of the anode and cathode should be at least partially transparent to allow the generated light to be observed.

Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino) phenyl]cyclohexane (TAPC), N,N'-bis(4-methylphenyl)-N,N'-bis(4-ethylphenyl)-[1,1'-(3,3'-dimethyl)biphenyl]4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino) benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino) styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)4,4'-diamine (TTB), and porphyrinic compounds, such as copper phthalocyanine. Commonly used hole transporting polymers are polyvinylcarbazole, (phenylmethyl)polysilane, and polyaniline. It is also possible to obtain hole transporting polymers by doping hole transporting molecules such as those mentioned above into polymers such as polystyrene and polycarbonate.

Examples of electron transport materials for layer 140 include metal chelated oxinoid compounds, such as tris(8-hydroxyquinolato)aluminum (Alq$_3$); phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). Layer 140 can function both to facilitate electron transport, and also serve as a buffer layer or confinement layer to prevent quenching of the exciton at layer interfaces. Preferably, this layer promotes electron mobility and reduces exciton quenching.

The cathode 150, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthamides, and the actinides. Materials such as aluminum, indium, calcium, barium, samarium and magnesium, as well as combinations, can be used. Li-containing organometallic compounds can also be deposited between the organic layer and the cathode layer to lower the operating voltage.

It is known to have other layers in organic electronic devices. For example, there can be a layer (not shown) between the conductive polymer layer 120 and the active layer 130 to facilitate positive charge transport and/or band-gap matching of the layers, or to function as a protective layer. Similarly, there can be additional layers (not shown) between the active layer 130 and the cathode layer 150 to facilitate negative charge transport and/or band-gap matching between the layers, or to function as a protective layer. Layers that are known in the art can be used. In addition, any of the above-described layers can be made of two or more layers. Alternatively, some or all of inorganic anode layer 110, the conductive polymer layer 120, the active layer 130, and cathode layer 150, may be surface treated to increase charge carrier transport efficiency. The choice of materials for each of the component layers is preferably determined by balancing the goals of providing a device with high device efficiency.

It is understood that each functional layer may be made up of more than one layer.

The device can be prepared by sequentially vapor depositing the individual layers on a suitable substrate. Substrates such as glass and polymeric films can be used. Conventional vapor deposition techniques can be used, such as thermal evaporation, chemical vapor deposition, and the like. Alternatively, the organic layers can be coated from solutions or dispersions in suitable solvents, using any conventional coating technique. In general, the different layers will have the following range of thicknesses: anode 110, 500-5000 Å, preferably 1000-2000 Å; hole transport layer 120, 50-1000 Å, preferably 200-800 Å; light-emitting layer 130, 10-1000 Å, preferably 100-800 Å; electron transport layer 140, 50-1000 Å, preferably 200-800 Å; cathode 150, 200-10000 Å, preferably 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

It is understood that the efficiency of devices made with the iridium compounds of the invention, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

The iridium complexes of the invention often are phosphorescent and photoluminescent and may be useful in applications other than OLEDs. For example, organometallic complexes of iridium have been used as oxygen sensitive indicators, as phosphorescent indicators in bioassays, and as catalysts. The bis cyclometalated complexes can be used to sythesize tris cyclometalated complexes where the third ligand is the same or different.

As used herein, the term "compound" is intended to mean an electrically uncharged substance made up of molecules that further consist of atoms, wherein the atoms cannot be separated by physical means. The term "ligand" is intended to mean a molecule, ion, or atom that is attached to the coordination sphere of a metallic ion. The term "complex", when used as a noun, is intended to mean a compound having at least one metallic ion and at least one ligand. The term "group" is intended to mean a part of a compound, such a substituent in an organic compound or a ligand in a complex. The term "facial" is intended to mean one isomer of a complex, $Ma_3b_3$, where "a" and "b" represent different coordinating atoms, having octahedral geometry, in which the three "a" atoms are all adjacent, i.e. at the corners of one face of the octahedron. The term "meridional" is intended to mean one isomer of a complex, $Ma_3b_3$, having octahedral geometry, in which the three "a" atoms occupy three positions such that two are trans to each other. The term "hexacoordinate" is intended to mean that six groups or points of attachment are coordinated to a central metal. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). The term "photoactive" refers to any material that exhibits electroluminescence and/or photosensitivity. In the Formulae and Equations, the letters L, R, Y, and Z are used to designate atoms or groups which are defined within. All other letters are used to designate conventional atomic symbols. The term "(H+F)" is intended to mean all combinations of hydrogen and fluorine, including completely hydrogenated, partially fluorinated or perfluorinated substituents.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

The following examples illustrate certain features and advantages of the present invention. They are intended to be illustrative of the invention, but not limiting. All percentages are by weight, unless otherwise indicated.

Example 1

This example illustrates the preparation of a ligand precursor compound having Formula II, where $R^2=CF_3$, and $R^1=R^3=H$.

Preparation of 2,4-difluoro-3-trifluoromethylbenzeneboronic acid

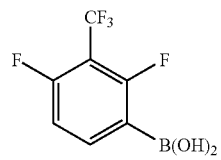

To a solution of 2.4 g of 2,6-difluoro-trifluoromethylbenzene in the mixture of 25 ml of dry ether and 25 ml of dry THF 7 ml of solution 2M butyl lithium in pentane was added dropwise at −70° C. The reaction mixture was stirred 15 min at −70° C. and 2 g of trimethylborate was added. The reaction was allowed to warm up to 25° C. and was diluted with 200 ml of 10% hydrochloric acid and extracted with ether (2×50 ml). The combined organic layers were washed with water (2×100 ml), dried over $MgSO_4$ and solvent was remover under vacuum at 50° C. to leave 3.4 g of crude boronic acid (containing ~50% of THF), which was used for the next reaction without further purification. $^1H$ NMR ($CDCl_3$): 6.9 (2H, t), 7.9 (1H, q), 5.3 (2H, br s); $^{19}F$ NMR: −56.68(3F, t), −106.0 (1F, m), −108.0(1F, m).

Preparation of 2-(2,4-difluoro-3-trifluoromethylphenyl)-pyridine Formula VIII

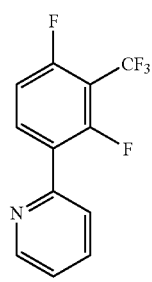

To a solution of 10 g potassium carbonate in 100 ml of degassed water, the solution of 3.4 g 2,4-difluoro-3-trifluoromethylbenzeneboronic acid (50% purity, the rest THF) in 50 ml of monoglyme was added, followed by the addition of 3.5 g of 2-bromopyridine, 0.1 g of dicyclohexyl(biphenyl) phosphine, 0.05 g of palladium acetate. The reaction mixture was refluxed (90-95° C.) for 16 h. The reaction mixture was diluted with 500 ml of water, extracted with dichloromethane (3×50 ml), the organic layer was washed with water (1×300 ml), dried over $MgSO_4$ and solvent was removed under vacuum. Crude product (3.2 g) was dissolved in 50 ml of hexane and the solution was passed through a short plug of silicagel (Silicagel 60, EM Science). The column was washed with another 30 ml of hexane. From final solution hexane was removed under vacuum to leave 1.6 g of slightly yellow liquid, which based on NMR analysis was 2-(2,4-difluoro-3-trifluoromethylphenyl)-pyridine, containing 27% of 2-bromopyridine. The crude material was used for the next reaction without further purification.

Example 2

This example illustrates the preparation of a complex of the invention having Formula XIII:

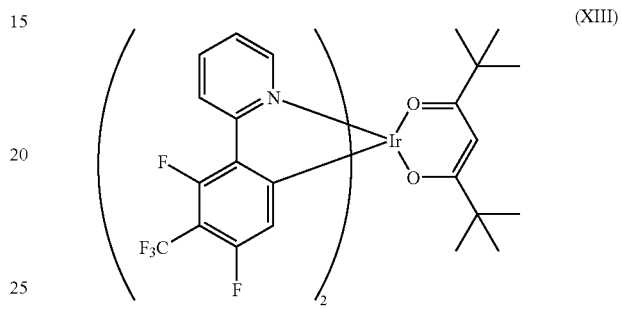

0.52 g of the ligand precursor from Example 1 was mixed with 0.38 g iridium chloride in 10 mL 2-ethoxyethanol and 1 mL water. This mixture was refluxed under nitrogen for 30 mins. The mixture was cooled, and to the cooled mixture was added 0.2 g di-t-butylacetylacetone (tetramethylheptanedione) and 300 mg sodium carbonate. Refluxing was continued for at least 30 mins. This was then cooled, evaporated to dryness in a nitrogen stream, extracted into methylene chloride, and filtered. The methylene chloride extract was dark orange in color and blue-green luminescent. The methylene chloride solution was then evaporated to dryness and chromatographed on silica to isolate the blue luminescent fraction. This fraction was then recrystallized from methylene chloride/methanol.

Analysis by nmr indicated the material to be the complex having Formula XIII.

Example 3

This example illustrates the preparation of the precursor phosphino-alcohol compound 1,1-bis(trifluoromethyl)-2-bis(triphenylphosphino)-ethanol ("PO-1H") for the ligand having Formula VII. The compound was made by two different methods.

Method a:

The phosphino alkanol was made according to the procedure in *Inorg. Chem.* (1985), 24 (22), pp. 3680-7. Under nitrogen, 1,1-bis(trifluoromethyl)ethylene oxide (12 g, 0.066 mol) was added dropwise to a pre-cooled (10-15° C.) solution of diphenylphosphine (10 g, 0.053 mol) in dry THF (50 mL). The reaction mixture was stirred at 25° C. for 2 days, after which NMR analysis indicated >90% conversion. The solvent was removed under vacuum and the residual viscous oil was distilled under vacuum to give 8 g of the fraction (b.p. 110-114° C. at 0.05 mm Hg) which crystallized on standing. Both the NMR data and m.p. (59-62° C.) of this material (>95% purity) were consistent with those reported in: Boere, R. T. et al., *Inorg. Chem.* (1985), 24, 3680. $^1H$ NMR ($CDCl_3$, 20° C.), δ: 7.3-7.8 (m, 10H, arom. H); 2.8 (br. s.; 1H, OH); 2.2 (s, 2H, CH$_2$). $^{19}$F NMR (CDCl$_3$, 20° C.), δ: −77.3 (d, J$_{F-P}$=15.5 Hz). $^{31}$P NMR (CDCl$_3$, 20° C.), δ: −24.4 (septet, J$_{P-F}$=15.5 Hz).

Method b:

(i) Preparation of 1,1-bis(trifluoromethyl)-2-bromoethanol, BrCH$_2$C(CF$_3$)$_2$OH. 1,1-bis(trifluoromethyl)oxirane (100 g; 0.55 mol; prepared as described in WO 00/66575, 2000, to DuPont). was added slowly to 100 ml of 47% aqueous HBr placed in a round bottom glass flask equipped with a dry-ice condenser, thermometer, and magnetic stir bar at 30-40° C. The reaction mixture was stirred under reflux for 3 h. At that point the temperature raised to 90° C. After cooling to room temperature, the bottom layer was separated, dried over MgSO$_4$, and distilled to give 104 g (72%) of BrCH$_2$C(CF$_3$)$_2$OH, b.p. 101-103° C. $^1$H NMR (CDCl$_3$): 3.50 (br s, 1H, —OH), 3.70(s, 2H, CH$_2$). $^{19}$F NMR (CDCl$_3$): -75.9 (s). This material was dried over freshly calcined molecular sieves (4 Å) prior to the next step.

(ii) Under nitrogen, to a stirring solution of 1,1-bis(trifluoromethyl)-2-bromoethanol (5.64 g; prepared as described above) in dry ether (110 mL) cooled to −78° C., was added drop-wise 1.6 M n-BuLi in hexanes (Aldrich; 27 mL). After 1 h at −78° C., chlorodiphenylphosphine (Strem; 4.53 g) was added drop-wise, at vigorous stirring, to the resulting solution of the dilithiated derivative. After stirring the mixture for 3 h 20 min at −78° C., it was allowed to warm slowly to room temperature and then stirred at room temperature overnight. The solvents were removed under vacuum. Dichloromethane (10 mL) and trifluoroacetic acid (1.66 mL) were added to the residue, and the mixture was chromatographed on a silica gel column (5×25 cm) with dichloromethane. The product was isolated as an oil which crystallized upon drying under vacuum. The yield of the product as white crystalline solid was 5.3 g (71%). The compound was found identical with the material synthesized according to method a.

Example 4

This example illustrates the preparation of a complex of the invention having Formula XIV:

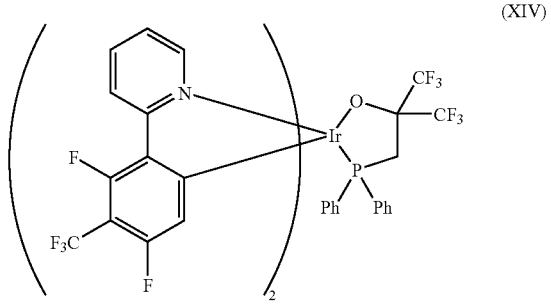

(XIV)

0.26 g of the ligand precursor from Example 1 was mixed with 0.19 g iridium chloride in 10 mL 2-ethoxyethanol and 1 mL water. This mixture was refluxed under nitrogen for 30 mins. The mixture was cooled, and to the cooled mixture was added 0.37 g phosphinoalcohol (2eq) from Example 3 and 300 mg sodium carbonate. Refluxing was continued for at least 30 mins. This was then cooled, evaporated to dryness in a nitrogen stream, extracted into methylene chloride, and filtered. The methylene chloride extract was light yellow in color and blue green luminescent. This solution was evaporated to dryness and chromatographed to isolate the blue luminescent fraction.

Analysis by TLC showed a very deep blue phosphorescent spot running at the solvent front and a turquoise phosphorescent spot running behind as the major fraction. A silica column with methylene chloride eluent was used to separate the two materials. Two fractions were collected: (i) a small amount of the fast running bluer material and (ii) a larger amount of pale yellow glassy material which was turquoise luminescent. Both of these materials were recrystallized from ethylacetate/hexanes to give pale crystals—blocks for the first material (i), and needles for the second material (ii). The major material was approximately 250 mg of fluffy pale yellow needles. Solutions of this material were sky blue photoluminescent. The solid was turquoise photoluminescent. Analysis by nmr indicated that this material had Formula XIV.

The second material was purified by additional chromatography using 50:50 hexanes:methylene chloride. A non-luminescent yellow band washed out ahead of the bright blue photoluminescent band. The blue photoluminescent band material was collected as a white solid (~25 mg). Analysis by nmr indicated that this material was a monocyclometallated hydrido material having Formula XV:

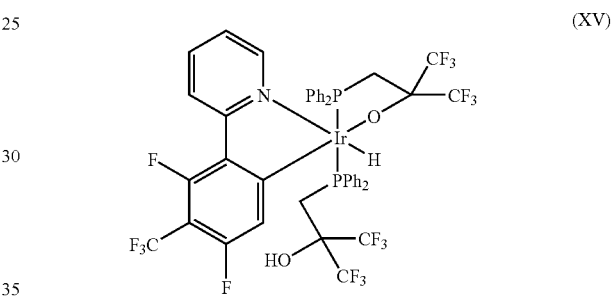

(XV)

In this complex there are two phosphino alcohol ligands, one which is bidentate and one which is monodentate.

What is claim is:

1. A compound selected from Formula X, and Formula XI:

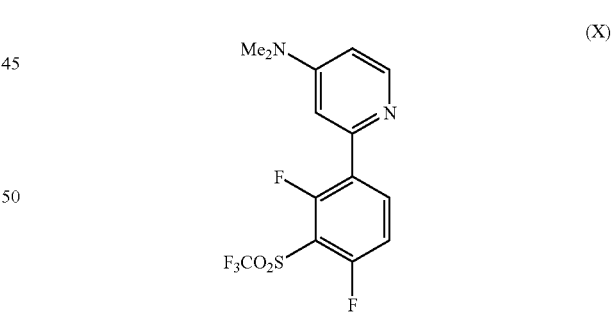

(X)

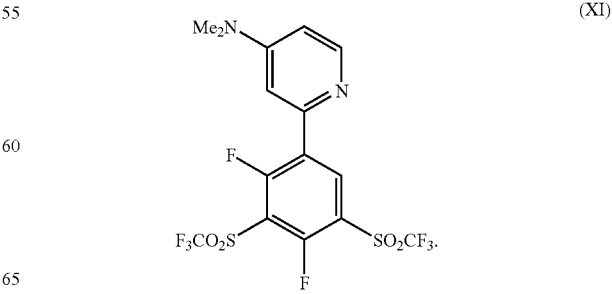

(XI)

2. An organic electronic device comprising at least one layer comprising an electroluminescent compound that has blue luminescence having a structure selected from Formula XIV, and Formula XV below:
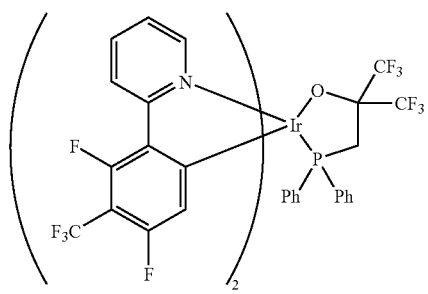
(XIV)
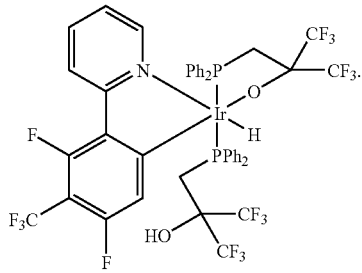
(XV)
* * * * *